United States Patent
Fukushima et al.

(10) Patent No.: US 10,090,060 B2
(45) Date of Patent: Oct. 2, 2018

(54) DATA COMMUNICATION SYSTEM AND DATA RECEIVING DEVICE

(71) Applicant: TOSHIBA MEMORY CORPORATION, Minato-ku (JP)

(72) Inventors: Akihiro Fukushima, Yokohama (JP); Shuji Matsumoto, Sagamihara (JP); Makoto Hara, Yokohama (JP); Yasushi Yamakawa, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 92 days.

(21) Appl. No.: 15/255,961

(22) Filed: Sep. 2, 2016

(65) Prior Publication Data

US 2017/0248654 A1   Aug. 31, 2017

Related U.S. Application Data

(60) Provisional application No. 62/300,946, filed on Feb. 29, 2016.

(51) Int. Cl.
*G11C 29/00* (2006.01)
*G11C 29/02* (2006.01)
*G11C 29/38* (2006.01)
*G11C 16/34* (2006.01)

(52) U.S. Cl.
CPC ............ *G11C 29/00* (2013.01); *G11C 29/022* (2013.01); *G11C 29/38* (2013.01); *G11C 16/349* (2013.01)

(58) Field of Classification Search
CPC .......... G01R 31/31703; G01R 31/3177; G11C 29/00; G11C 29/022; G11C 29/38; G11C 16/349
See application file for complete search history.

(56) References Cited

U.S. PATENT DOCUMENTS

| | | |
|---|---|---|
| 6,477,090 B2 | 11/2002 | Yamaki et al. |
| 7,535,765 B2 | 5/2009 | Maayan |
| 2006/0036803 A1 | 2/2006 | Edan et al. |
| 2012/0025865 A1* | 2/2012 | Shimizu ......... H03K 19/018521 326/16 |
| 2012/0161800 A1* | 6/2012 | Ishida ............... G01R 31/31703 324/750.01 |
| 2015/0121018 A1* | 4/2015 | Lee ...................... G11C 7/1081 711/156 |
| 2016/0035411 A1* | 2/2016 | Yu ........................ G11C 11/4091 365/189.07 |

FOREIGN PATENT DOCUMENTS

| | | |
|---|---|---|
| JP | 2002-74997 | 3/2002 |
| JP | 2006-59355 | 3/2006 |
| JP | 2009-20996 | 1/2009 |

* cited by examiner

*Primary Examiner* — Thien Nguyen
(74) *Attorney, Agent, or Firm* — Oblon, McClelland, Maier & Neustadt, L.L.P.

(57) ABSTRACT

According to one embodiment, a data communication system includes: a data transmitting device that transmits a test pattern; and a data receiving device that receives the test pattern. The data receiving device receives the test pattern with every change in a threshold for determining whether received data is High or Low, compares the test pattern to an expected value for the respective changed thresholds, and selects the threshold based on the result of comparison between the test pattern and the expected value.

20 Claims, 7 Drawing Sheets

| VREF \ TEST PATTERN | D0 | D1 | D2 | D3 | D4 | D5 |
|---|---|---|---|---|---|---|
| VREF0 | × | × | × | × | ○ | × |
| VREF1 | × | ○ | ○ | × | ○ | ○ |
| VREF2 | ○ | ○ | ○ | × | ○ | ○ |
| VREF3 | ○ | ○ | ○ | ○ | ○ | ○ |
| VREF4 | ○ | ○ | ○ | ○ | ○ | ○ |
| VREF5 | ○ | ○ | ○ | ○ | ○ | ○ |
| VREF6 | ○ | ○ | × | × | × | × |
| VREF7 | × | ○ | × | × | × | × |

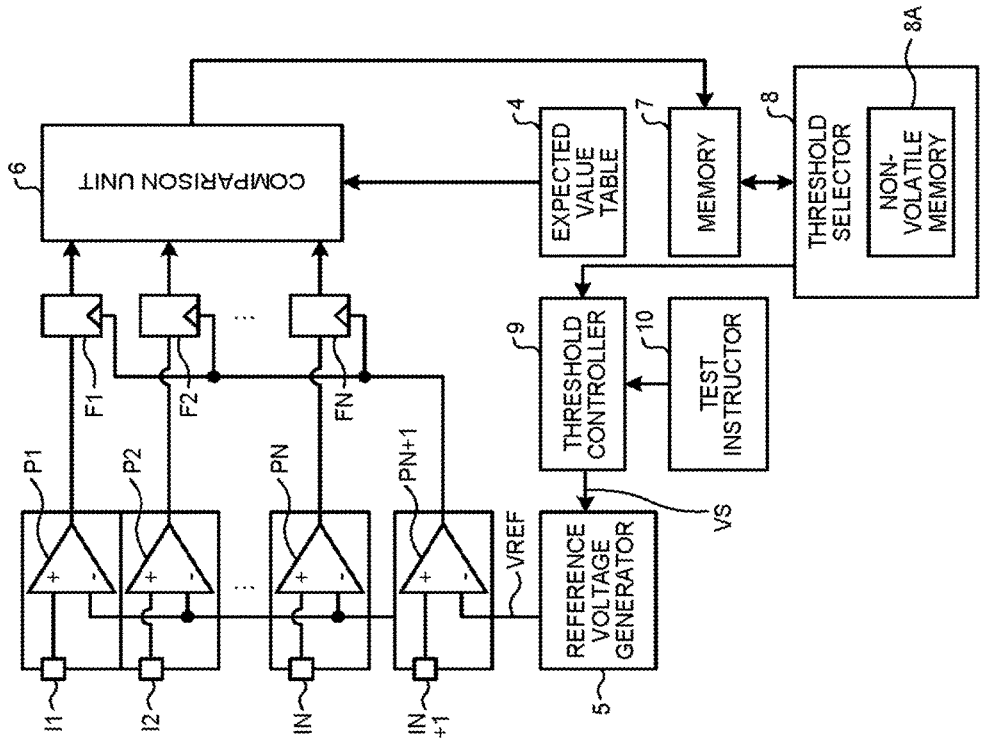
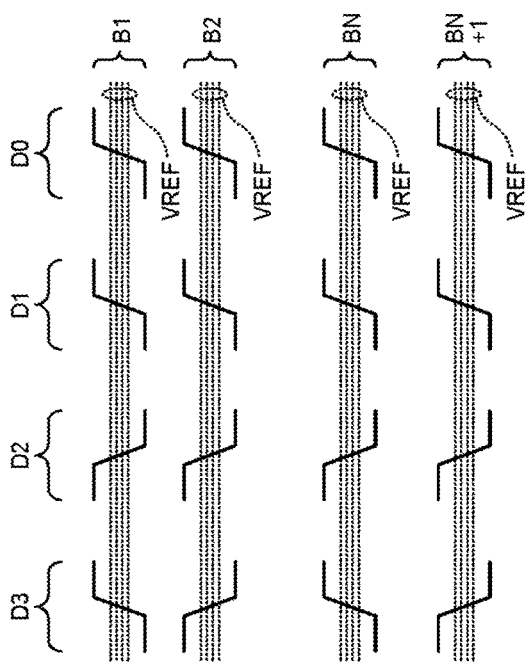

FIG.3

| TEST PATTERN<br>VREF | D0 | D1 | D2 | D3 | D4 | D5 |
|---|---|---|---|---|---|---|
| VREF0 | × | × | × | × | ○ | × |
| VREF1 | × | ○ | ○ | × | ○ | ○ |
| VREF2 | ○ | ○ | ○ | × | ○ | ○ |
| VREF3 | ○ | ○ | ○ | ○ | ○ | ○ |
| VREF4 | ○ | ○ | ○ | ○ | ○ | ○ |
| VREF5 | ○ | ○ | ○ | ○ | ○ | ○ |
| VREF6 | ○ | ○ | × | × | × | × |
| VREF7 | × | ○ | × | × | × | × |

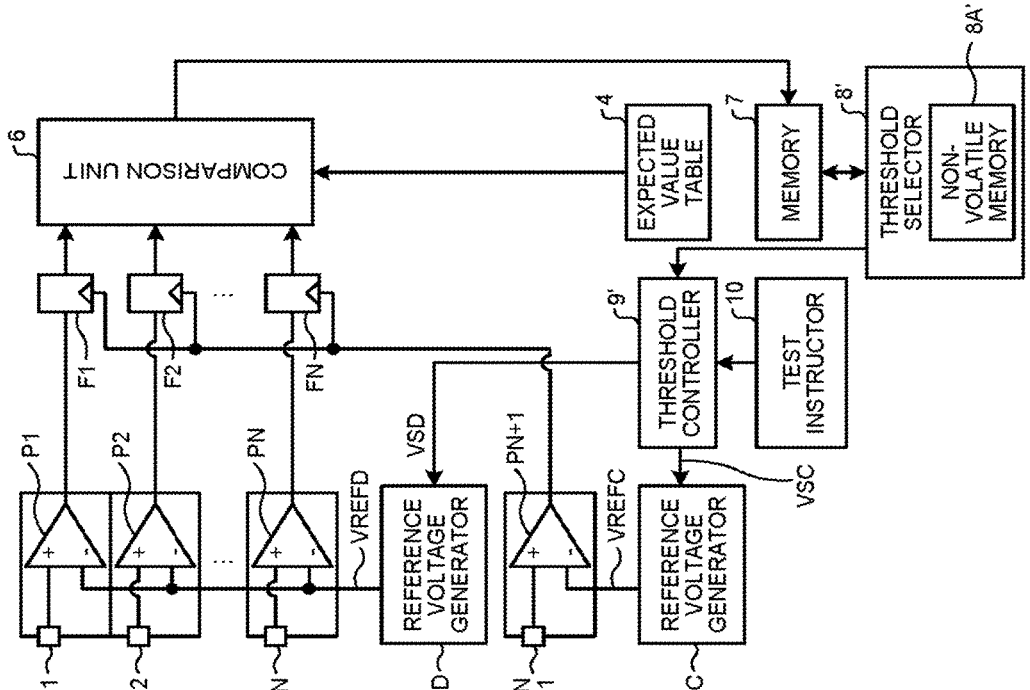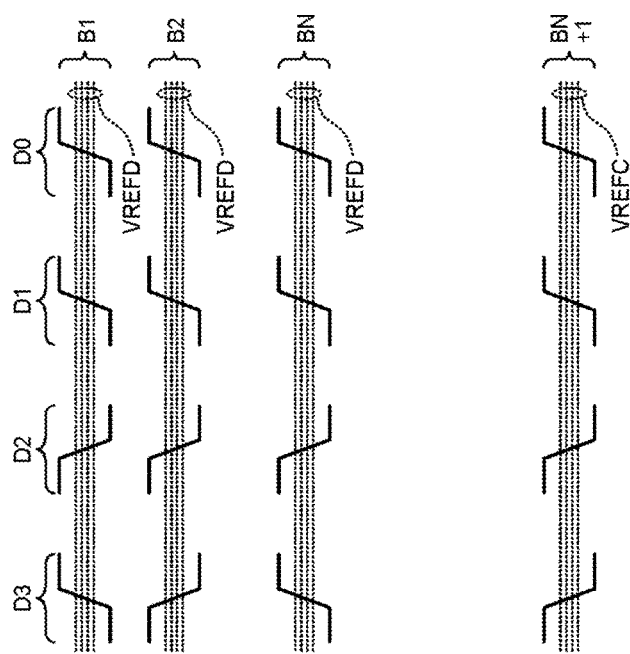

FIG.7

| VREFC \ VREFD | VREFD 0 | VREFD 1 | VREFD 2 | VREFD 3 | VREFD 4 | VREFD 5 | VREFD 6 | VREFD 7 |
|---|---|---|---|---|---|---|---|---|
| VREFC0 | × | × | × | × | × | × | × | × |
| VREFC1 | × | × | × | × | × | × | ○ | × |
| VREFC2 | × | × | × | ○ | ○ | ○ | × | × |
| VREFC3 | × | × | ○ | ○ | ○ | ○ | × | × |
| VREFC4 | × | × | ○ | ○ | ○ | ○ | × | × |
| VREFC5 | × | × | ○ | × | × | × | × | × |
| VREFC6 | × | × | × | × | × | × | × | × |
| VREFC7 | × | × | × | × | × | × | × | × |

DATA COMMUNICATION SYSTEM AND DATA RECEIVING DEVICE

CROSS-REFERENCE TO RELATED APPLICATIONS

This application is based upon and claims the benefit of priority from U.S. Provisional Application No. 62/300,946, filed on Feb. 29, 2016; the entire contents of which are incorporated herein by reference.

FIELD

Embodiments described herein relate generally to a data communication system and a data receiving device.

BACKGROUND

In a data receiving device, the level of received data is compared to a threshold to determine whether the received data is High or Low.

BRIEF DESCRIPTION OF THE DRAWINGS

FIG. 2A is a diagram illustrating an example of test patterns for use in the data communication system according to the first embodiment, and FIG. 2B is a block diagram illustrating an example of a communication interface illustrated in FIG. 1;

FIG. 3 is a diagram illustrating an example of results of comparison between test patterns and an expected value for respective thresholds in the data communication system according to the first embodiment;

FIG. 6A is a diagram illustrating an example of test patterns for use in a data communication system according to a third embodiment, and FIG. 6B is a block diagram illustrating an example of a communication interface of a data receiving device for use in the data communication system; and FIG. 7 is a diagram illustrating an example of results of comparison between test patterns and an expected value for respective thresholds in the data communication system according to the third embodiment.

DETAILED DESCRIPTION

In general, according to one embodiment, a data communication system includes: a data transmitting device that transmits a test pattern; and a data receiving device that receives the test pattern. The data receiving device receives the test pattern with every change in a threshold for determining whether the received data is High or Low, compares the test pattern to an expected value for the respective changed thresholds, and selects the threshold based on the result of the comparison between the test pattern and the expected value.

Exemplary embodiments of a data communication system will be explained below in detail with reference to the accompanying drawings. The present invention is not limited to the following embodiments.

First Embodiment

Figure 1:
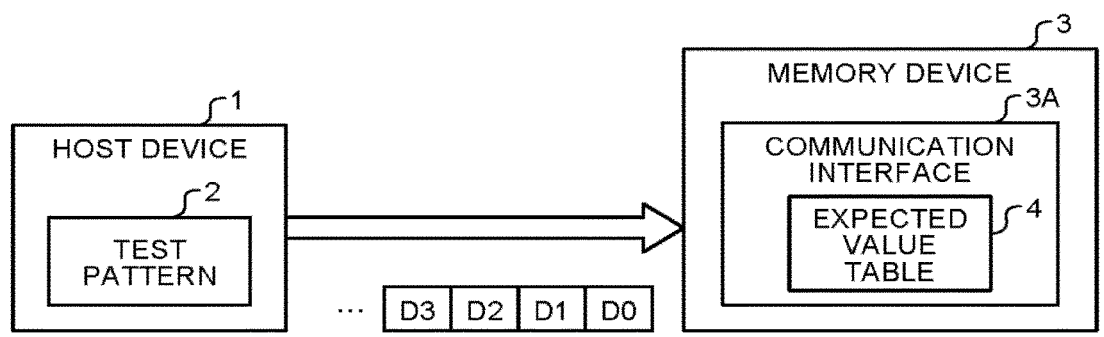
FIG. 1 is a schematic block diagram of a data communication system according to a first embodiment.

FIG. 1 is a schematic block diagram of a data communication system according to a first embodiment.

Referring to FIG. 1, the data communication system is provided with a host device 1 and a memory device 3. In the data communication system, the host device 1 can be used as a data transmitting device and the memory device 3 can be used as a data receiving device. The host device 1 may be an eMMC (embedded Multi Media Card) host, and the memory device 3 may be an eMMC memory, for example.

The host device 1 can transmit a test pattern 2 to the memory device 3. The memory device 3 can receive the test pattern 2 from the host device 1. The host device 1 can hold the test pattern 2. The memory device 3 is provided with a communication interface 3A. The communication interface 3A can have a single-ended configuration in which a plurality of bits is transmitted in parallel. The communication interface 3A is provided with an expected value table 4. The expected value table 4 can store an expected value corresponding to the test pattern 2. The test pattern 2 can have data D0, D1, D2, D3, . . . DM−1 for M (M is an integer of 2 or more) lines. The data D0, D1, D2, D3, . . . DM−1 can have an N (N is a positive integer)+1-bit configuration.

The communication interface 3A can receive the test pattern 2 with every change in the threshold for determining whether the received data is High or Low (also called threshold voltage of input I/O), compare the test pattern 2 to the expected value for the respective changed thresholds, and select the threshold based on the result of comparison between the test pattern 2 and the expected value.

FIG. 2A is a diagram illustrating an example of test patterns for use in the data communication system according to the first embodiment, and FIG. 2B is a block diagram illustrating an example of the communication interface illustrated in FIG. 1.

Referring to FIG. 2A, the test pattern 2 is provided with test data D0, D1, D2, and D3. Bits B1 to BN of the test data D0, D1, D2, and D3 can be used for data test pattern. Bits BN+1 of the test data D0, D1, D2, and D3 can be used for clock test pattern.

In the data communication system in which data is transmitted in parallel, there is a tendency that noise occurs between the adjacent bits. Accordingly, it is preferred to set the values of the test data D0, D1, D2, and D3 (the values here are High or Low) such that all of combinations of High and Low can be obtained between the adjacent bits. For example, the values of the test data D0, D1, D2, and D3 may be set such that all of the patterns in the case where High is continued, in the case where Low is continued, in the case where switchover takes place from High to Low, and in the case where switchover takes place from Low to High between the adjacent test data D0, D1, D2, and D3 and between the adjacent bits B1 to BN+1 are included.

Referring to FIG. 2B, the communication interface 3A is provided with comparators P1 to PN+1, flip-flops F1 to FN, an expected value table 4, a reference voltage generator 5, a comparison unit 6, a memory 7, a threshold selector 8, a threshold controller 9, and a test instructor 10. The memory 7 can be a DRAM or the like. The threshold selector 8 is provided with a non-volatile memory 8A. The non-volatile memory 8A can be an NAND flash memory or the like.

Non-inverting inputs of the comparators P1 to PN+1 are connected to input terminals I1 to IN+1. Inverting inputs of the comparators P1 to PN+1 are connected to the reference voltage generator 5. Output terminals of the comparators P1 to PN are connected to data input terminals of the flip-flops F1 to FN. An output terminal of the comparator PN+1 is connected to clock input terminals of the flip-flops F1 to FN. Output terminals of the flip-flops F1 to FN are connected to the comparison unit 6.

When the host device 1 sends the test data D0, D1, D2, and D3, the test instructor 10 instructs the threshold controller 9 to change a threshold VREF. To determine whether the host device 1 sends the test data D0, D1, D2, and D3, the host device 1 may send a command indicative of test pattern transmission to the memory device 3 immediately before the host device 1 sends the test data D0, D1, D2, and D3, or the memory device 3 may send a command indicative of test pattern request to the host device 1.

When the host device 1 sends the test data D0, D1, D2, and D3, the bits B1 to BN+1 of the test data D0, D1, D2, and D3 are input to the comparators P1 to PN+1 via the input terminals I1 to IN+1, respectively. The comparators P1 to PN+1 compare the values of the bits B1 to BN+1 of the test data D0, D1, D2, and D3 to the threshold VREF, and determines whether the bits B1 to BN+1 of the test data D0, D1, D2, and D3 are High or Low. Then, according to the values of the bit BN+1 of the test data D0, D1, D2, and D3, the values of the bits B1 to BN of the test data D0, D1, D2, and D3 are taken into the flip-flops F1 to FN.

Then, the values of the bits B1 to BN of the test data D0, D1, D2, and D3 taken into the flip-flops F1 to FN are compared to the expected value, and the results of comparison are stored in the memory 7.

The host device 1 repeats the transmission of the test data D0, D1, D2, and D3 plural times. Each time the host device 1 transmits the test data D0, D1, D2, and D3, the threshold controller 9 outputs a switch signal VS to the reference voltage generator 5. Each time the host device 1 transmits the test data D0, D1, D2, and D3, the reference voltage generator 5 changes the threshold VREF.

With every change in the threshold VREF, the comparators P1 to PN+1 compare the values of the bits 21 to BN+1 of the test data D0, D1, D2, and D3 to the threshold VREF, and determine whether the bits B1 to BN+1 of the test data D0, D1, D2, and D3 are High or Low. Then, according to the values of the bit BN+1 of the test data D0, D1, D2, and D3, the values of the bits B1 to BN of the test data D0, D1, D2, and D3 are taken into the flip-flops F1 to FN.

Then, the values of the bits B1 to BN of the test data D0, D1, D2, and D3 taken into the flip-flops F1 to FN are compared to the expected value, and the results of comparison are stored in the memory 7 for the respective changed thresholds VREF.

Then, the threshold selector 8 selects the threshold VREF based on the comparison results stored in the memory 7. At that time, the threshold selector 8 can select the threshold VREF with which all the values of the bits B1 to BN of the test data D0, D1, D2, and D3 match the expected value. When the threshold VREF has a range in which all the values of the bits B1 to BN of the test data D0, D1, D2, and D3 match the expected value, the threshold selector 8 can select the median threshold VREF in the range. The threshold VREF selected by the threshold selector 8 can be stored in the non-volatile memory 8A.

Then, the threshold selector 8 selects the threshold VREF stored in the non-volatile memory 8A at the time of subsequent data reception, and informs the same to the threshold controller 9. The threshold controller 9 outputs to the reference voltage generator 5 the switch signal VS corresponding to the threshold VREF selected by the threshold selector 8. The reference voltage generator 5 sets the threshold VREF selected by the threshold selector 8, and outputs the same to the comparators P1 to PN+1.

Accordingly, the memory device 3 can optimize the threshold VREF depending on the state of a data transmission path between the host device 1 and the memory device 3. Therefore, it is possible to, at the time of data reception after the reception of the test pattern 2, improve the accuracy of determination on whether the data is High or Low, thereby improving the reliability of data transmission.

FIG. 3 is a diagram illustrating an example of results of comparison between test patterns and the expected value for respective thresholds in the data communication system according to the first embodiment. Referring to FIG. 3, the threshold VREF is changeable in eight stages of VREF0 to VREF7, and the test pattern 2 is composed of test data D0 to D5 as an example. For example, the relationship VREF0<VREF1<VREF2<VREF3<VREF4<VREF5< VREF6<VREF7 can hold. The symbol ○ indicates that the test data D0 to D5 match the expected value, and the symbol x indicates that the test data D0 to D5 do not match the expected value.

Referring to FIG. 3, with the thresholds VREF0 to VREF2, VREF6, and VREF7, the test data D0 to D5 do not match the expected value in some cases. With the thresholds VREF3 to VREF5, all the test data D0 to D5 match the expected value.

Accordingly, the threshold selector 8 can select the threshold VREF from among the thresholds VREF3 to VREF5 at the time of subsequent data reception. In this example, since the thresholds VREF3 to VREF5 have ranges in which all the test data D0 to D5 match the expected value, it is preferred to select the median threshold VREF4 among the thresholds VREF3 to VREF5. By selecting the threshold VREF4, it is possible to provide the threshold VREF with a margin of correct data determination, and improve the reliability of data transmission.

Referring to FIG. 3, the threshold VREF is changeable in the eight stages of VREF0 to VREF7 as an example. Alternatively, the threshold VREF may be changeable in P (P is an integer of 2 or more) stages.

Figure 4:
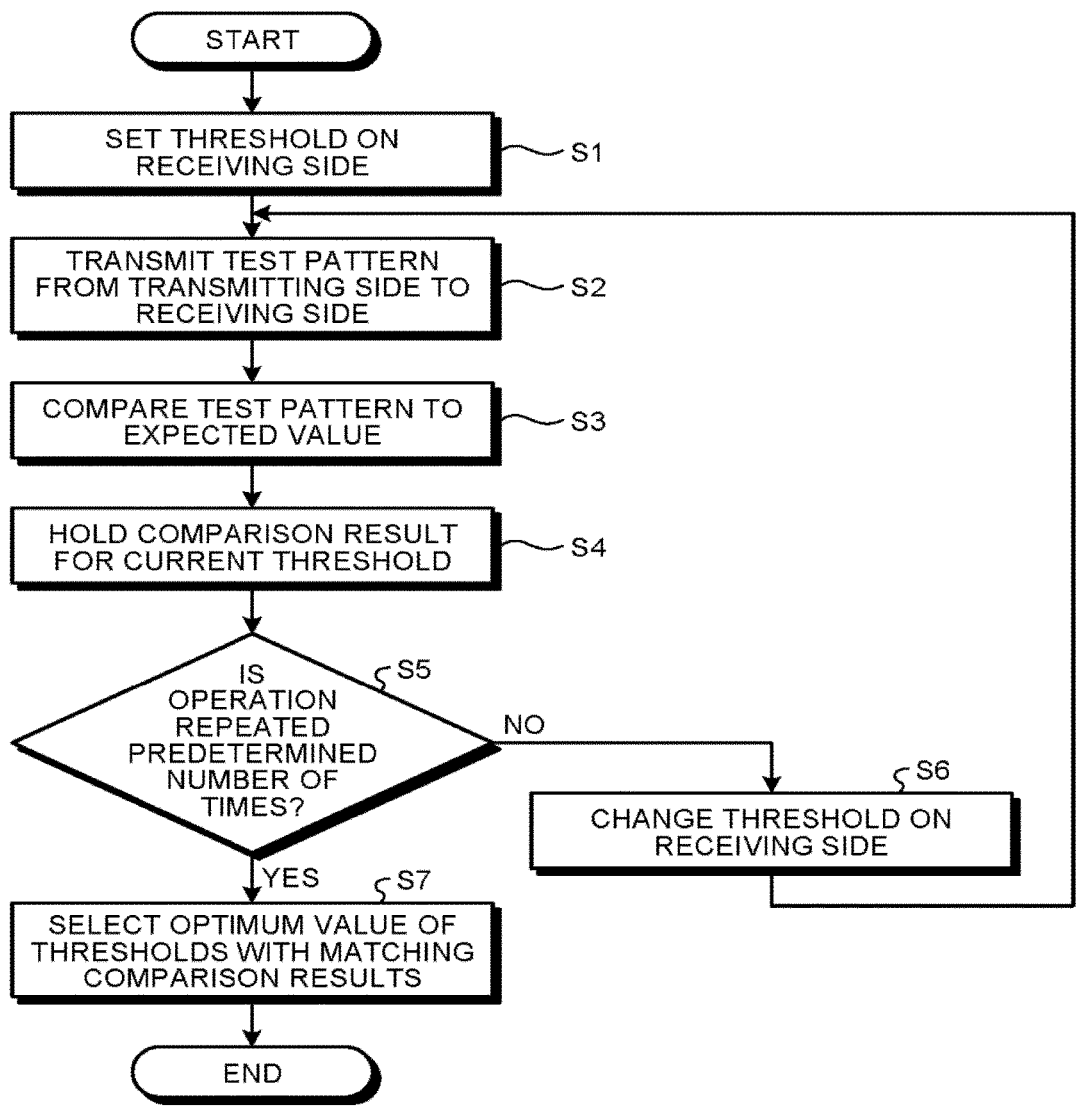
FIG. 4 is a flowchart of test operation in the data communication system according to the first embodiment.

FIG. 4 is a flowchart of test operation in the data communication system according to the first embodiment. In FIG. 4, the host device 1 illustrated in FIG. 1 is set as transmitting side, and the memory device 3 as receiving side.

Referring to FIG. 4, the threshold VREF on the receiving side is set before reception of the test pattern 2 (S1). The test pattern 2 is transmitted from the transmitting side to the receiving side (S2).

The test pattern 2 is compared to the expected value on the receiving side (S3). The result of comparison between the test pattern 2 and the expected value for the threshold VREF this time is held on the receiving side (S4). It is determined whether the reception of the test pattern 2 is repeated a predetermined number of times (S5). In this example, when the threshold VREF is changeable in the P stages on the receiving side, the predetermined number of times can be set to P, for example. The predetermined number of times may be set to 2 or more and P or less.

When the data reception is not repeated the predetermined number of times, the threshold VREF on the receiving side is changed (S6), and S2 to S6 are repeated the predetermined number of times. After repeating the predetermined number of times, an optimum value out of the thresholds VREF with a match between the test pattern 2 and the expected value is selected (S7). The optimum value can be a median value of the thresholds VREF with a match between the test pattern 2 and the expected value.

In the foregoing embodiment, the data transmitting device is the host device 1 and the data receiving device is the memory device 3 as an example. However, the data communication system can be formed in any manner as long as it has a single-ended configuration in which a plurality of bits is transferred in parallel. The data transmitting device and the data receiving device may be of a master-slave system.

Second Embodiment

Figure 5:
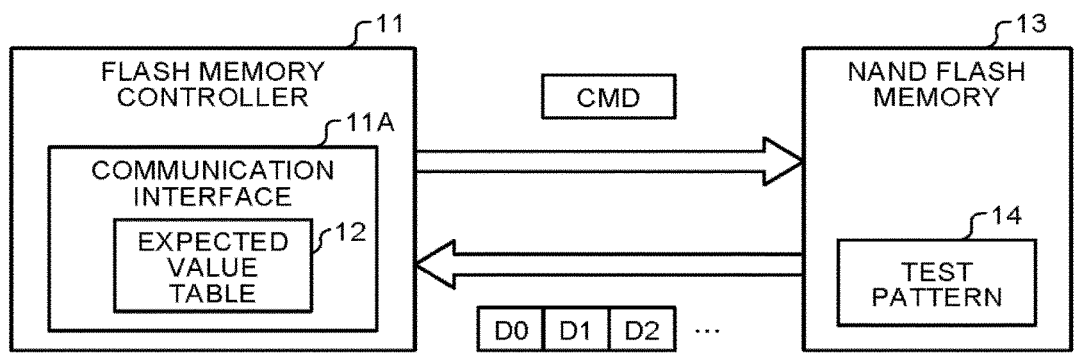
FIG. 5 is a schematic block diagram of a data communication system according to a second embodiment.

FIG. 5 is a schematic block diagram of a data communication system according to a second embodiment.

Referring to FIG. 5, the data communication system is provided with a flash memory controller 11 and an NAND flash memory 13. In the data communication system, the NAND flash memory 13 can be used as a data transmitting device, and the flash memory controller 11 can be used as a data receiving device. The flash memory controller 11 and the NAND flash memory 13 can be loaded into an SD card or the like, for example.

The NAND flash memory 13 can transmit a test pattern 14 to the flash memory controller 11 in response to a test pattern request command CMD. The flash memory controller 11 transmits the test pattern request command CMD and receives the test pattern 14 from the NAND flash memory 13. The NAND flash memory 13 can hold the test pattern 14.

The flash memory controller 11 is provided with a communication interface 11A. The communication interface 11A can have a single-ended configuration in which a plurality of bits is transferred in parallel. The communication interface 11A is provided with an expected value table 12. The expected value table 12 can store the expected value corresponding to the test pattern 14. The test pattern 14 can be configured in the same manner as the test pattern 2.

The communication interface 11A can receive the test pattern 14 with every change in the threshold for determining whether the received data is High or Low, compare the test pattern 14 to the expected value for the respective changed thresholds, and select the threshold based on the results of comparison between the test pattern 14 and the expected value.

The communication interface 11A transmits the test pattern request command CMD to the NAND flash memory 13 before the reception of the test pattern 14. Upon receipt of the test pattern request command CMD, the NAND flash memory 13 transmits the test pattern 14 to the flash memory controller 11.

The data communication system can perform the same process as described in FIG. 4 when the NAND flash memory 13 is set as the transmitting side and the flash memory controller 11 as the receiving side.

Accordingly, the flash memory controller 11 can optimize the threshold VREF depending on the state of a data transmission path between the flash memory controller 11 and the NAND flash memory 13. Therefore, when data is read from the NAND flash memory 13 after the reception of the test pattern 14, it is possible to determine whether the data is High or Low with higher determination accuracy, thereby improving the reliability of data reading.

Third Embodiment

FIG. 6A is a diagram illustrating an example of test patterns for use in a data communication system according to a third embodiment, and FIG. 6B is a block diagram illustrating an example of a communication interface of a data receiving device for use in the data communication system.

In the test pattern 2 of FIG. 2A, the threshold VREF is used for all the bits B1 to BN+1 of the test data D0, D1, D2, and D3. Meanwhile, in the test pattern 2 of FIG. 6A, a threshold VREFD is used for the bits B1 to BN of the test data D0, D1, D2, and D3, and a threshold VREFC is used for the bits BN+1 of the test data D0, D1, D2, and D3.

Referring to FIG. 6B, the data receiving device is provided with reference voltage generators 5C and 5D, a threshold selector 8', and a threshold controller 9', instead of the reference voltage generator 5, the threshold selector 8, and the threshold controller 9 illustrated in FIG. 2B. The threshold selector 8' is provided with a non-volatile memory 8A'. Reversing inputs of the comparators P1 to PN are connected to the reference voltage generator 5D, and a reversing input of the comparator PN+1 is connected to the reference voltage generator 5C.

When the host device 1 is supposed to send the test data D0, D1, D2, and D3, the test instructor 10 instructs the threshold controller 9' to change the thresholds VREFC and VREFD. At that time, the thresholds VREFC and VREFD can be separately changed.

When the host device 1 sends the test data D0, D1, D2, and D3, the bits B1 to BN+1 of the test data D0, D1, D2, and D3 are input into the comparators P1 to PN+1 via the input terminals I1 to IN+1. The comparators P1 to PN compare the values of the bits B1 to BN of the test data D0, D1, D2, and D3 to the threshold VREFD, and determine whether the bits B1 to BN of the test data D0, D1, D2, and D3 are High or Low. In addition, the comparator PN+1 compares the values of the bits BN+1 of the test data D0, D1, D2, and D3 to the threshold VREFC, and determines whether the bits BN+1 of the test data D0, D1, D2, and D3 are High or Low.

According to the values of the bits BN+1 of the test data D0, D1, D2, and D3, the values of the bits B1 to BN of the test data D0, D1, D2, and D3 are taken into the flip-flops F1 to FN. The values of the bits B1 to BN of the test data D0, D1, D2, and D3 taken into the flip-flops F1 to FN are compared to the expected value, and the results of comparison are stored in the memory 7.

The host device 1 repeats the transmission of the test data D0, D1, D2, and D3 plural times. Each time the host device 1 transmits the test data D0, D1, D2, and D3, the threshold controller 9' outputs switch signals VSC and VSD to the reference voltage generators 5C and 5D, respectively. The reference voltage generators 5C and 5D change the thresholds VREFC and VREFD every time the host device 1 transmits the test data D0, D1, D2, and D3.

With every change in the threshold VREFD, the comparators P1 to PN compare the values of the bits B1 to BN of the test data D0, D1, D2, and D3 to the threshold VREFD, and determine whether the bits B1 to BN of the test data D0, D1, D2, and D3 are High or Low. In addition, with every change in the threshold VREFC, the comparator PN+1 compares the values of the bits BN+1 of the test data D0, D1, D2, and D3 to the threshold VREFC, and determines whether the bits BN+1 of the test data D0, D1, D2, and D3 are High or Low.

According to the values of the bits BN+1 of the test data D0, D1, D2, and D3, the values of the bits B1 to BN of the test data D0, D1, D2, and D3 are taken into the flip-flops F1 to FN.

The values of the bits B1 to BN of the test data D0, D1, D2, and D3 taken into the flip-flops F1 to FN are compared to the expected value, and the results of comparison are stored in the memory 7 for the respective combinations of the changed thresholds VREFC and WREFD.

The threshold selector 8' selects the thresholds VREFC and WREFD based on the results of comparison stored in the memory 7. At that time, the threshold selector 8' can select the thresholds VREFC and WREFD with which all the values of the bits B1 to BN of the test data D0, D1, D2, and D3 match the expected value. When the thresholds VREFC and WREFD have ranges in which all the values of the bits B1 to BN of the test data D0, D1, D2, and D3 match the expected value, the median thresholds VREFC and WREFD can be selected in the ranges. The thresholds VREFC and WREFD selected by the threshold selector 8' can be stored in the non-volatile memory 8A'.

The threshold selector 8' selects the thresholds VREFC and WREFD stored in the non-volatile memory 8A' at the time of subsequent data reception, and informs the same to the threshold controller 9'. The threshold controller 9' outputs the switch signals VSC and VSD corresponding to the thresholds VREFC and WREFD selected by the threshold selector 8' to the reference voltage generators 5C and 5D, respectively. The reference voltage generators 5C and 5D set the thresholds VREFC and WREFD selected by the threshold selector 8', output the threshold VREFD to the comparators P1 to PN, and output the threshold VREFC to the comparator PN+1.

Accordingly, the memory device 3 can optimize the thresholds VREFC and VREFD depending on the state of a data transmission path between the host device 1 and the memory device 3. Therefore, it is possible to, at the time of data reception after the reception of the test pattern 2, improve the accuracy of determination on whether the data is High or Low, thereby improving the reliability of data transmission.

FIG. 7 is a diagram illustrating an example of results of comparison between test patterns and an expected value for respective thresholds in the data communication system according to the third embodiment. Referring to FIG. 7, the threshold VREFC is changeable in eight stages of VREFC0 to VREFC7, the threshold VREFD is changeable in eight stages of VREFD0 to VREFD7, and the test pattern 2 is composed of test data D0 to D5 as an example.

For example, the relationship VREFC0<VREFC1<VREFC2<VREFC3<VREFC4<VREFC5<VREFC6<VREFC7 can hold, and the relationship VREFD0<VREFD1<VREFD2<VREFD3<VREFD4<VREFD5<VREFD6<VREFD7 can hold. In this example, there are 64 combinations of the thresholds VREFC and WREFD. The test pattern 2 can be received with the respective 64 combinations. The symbol ○ indicates that the test data D0 to D5 match the expected value, the symbol x indicates that the test data D0 to D5 do not match the expected value.

Referring to FIG. 7, out of the 64 combinations of the thresholds VREFC and WREFD, 13 combinations allow all the test data D0 to D5 to match the expected value. Accordingly, at the time of subsequent data reception, the threshold selector 8' can select the thresholds VREFC and WREFD from the 13 combinations of the thresholds VREFC and WREFD. Since the 13 combinations of the thresholds VREFC and WREFD have ranges, it is preferred to select the median thresholds VREFC3 and VREFD4 in the 13 combinations of the thresholds VREFC and WREFD. The median thresholds VREFC3 and VREFD4 are in the middle of the combinations of the thresholds VREFC and VREFD with the symbol ○. Accordingly, it is possible to add margins to the thresholds VREFC and VREFD for correct data determination against various noises during data transmission, thereby improving the reliability of data transmission.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data communication system comprising:
a data transmitting device that transmits a test pattern; and
a data receiving device that receives the test pattern, wherein
the test pattern includes a data test pattern and a clock test pattern, the data test pattern including data bit sequence, the clock test pattern including clock bit, the data bit sequence having N (N is a positive integer) bits, the clock bit having one bit,
the data receiving device receives the N bits of the data bit sequence and the one bit of the clock bit in parallel, and
the data receiving device includes:
N first comparators corresponding to the N bits of the data bit sequence, the N first comparators comparing each of the N bits of the data bit sequence with a first threshold voltage in parallel to determine whether each of the N bits of the data bit sequence is at High level or Low level;
a second comparator corresponding to the one bit of the clock bit, the second comparator comparing the one bit of the clock bit with a second threshold voltage to determine whether the clock bit is at High level or Low level;
N flip-flops that hold the N bits of the data bit sequence in synchronization with the one bit of the clock bit; and
a comparison circuit that receives the held N bits of the data bit sequence in parallel as the data test pattern and that compares the data test pattern with an expected value.

2. The data communication system of claim 1, wherein the data receiving device further includes:
a selection circuit that selects, from a plural candidate values, a value of the first threshold voltage and a value of the second threshold voltage as a common value, based on a result of the comparison between the data test pattern and the expected value;
a control circuit that controls both of the value of the first threshold voltage for the N first comparators and the value of the second threshold voltage for the second comparator, to the selected common value; and
a memory that holds the expected value corresponding to the data test pattern.

3. The data communication system of claim 2, wherein the data receiving device further includes:
a generator that generates the common value for the fl threshold voltage and the second threshold voltage to provide the N first comparators and the second comparator with the common value in parallel.

4. The data communication system of claim 1, wherein the data receiving device transmits a test pattern request command to the data transmitting device before receipt of the test pattern, or the data transmitting device transmits a test pattern transmission command to the data receiving device before transmission of the test pattern.

5. The data communication system of claim 2, wherein when mapping information includes plural points obtained by associating the plural candidate values of the common value with plural candidate patterns of the data bit sequence and the mapping information has within the plural points a certain range of points where the data test pattern matches with the expected value corresponding to the data bit sequence, the selection circuit selects the common value corresponding to a middle point in the certain range of points.

6. The data communication system of claim 2, wherein the data receiving device stores the selected common value, and uses the common value stored at a time of subsequently receiving data to determine whether the data is at High level or Low level.

7. The data communication system of claim 1, wherein the data receiving device further includes:
   a selection circuit that selects, from a plural candidate values, a value of the first threshold voltage and a value of the second threshold voltage as different values, based on a result of the comparison between the data test pattern and the expected value;
   a control circuit that controls the value of the first threshold voltage for the N first comparators to a first value and the value of the second threshold voltage for the second comparator to a second value different from the first value; and
   a memory that holds the expected value corresponding to the data test pattern.

8. The data communication system of claim 1, wherein the data transmitting device is a host device and the data receiving device is a memory device.

9. The data communication system of claim 8, wherein the host device is an embedded Multi Media Card (eMMC) host and the data receiving device is an eMMC memory.

10. The data communication system of claim 1, wherein the data transmitting device is a NAND flash memory and the data receiving device is a memory controller.

11. A data receiving device that receives a test pattern, wherein
   the test pattern includes a data test pattern and a clock test pattern, the data test pattern including data bit sequence, the clock test pattern including clock bit, the data bit sequence having N (N is a positive integer) bits, the clock bit having one bit,
   the data receiving device receives the N bits of the data bit sequence and the one bit of the clock bit in parallel, and
   the data receiving device includes:
      N first comparators corresponding to the N bits of the data bit sequence, the N first comparators comparing each of the N bits of the data bit sequence with a first threshold voltage in parallel to determine whether each of the N bits of the data bit sequence is at High level or Low level;
      a second comparator corresponding to the one bit of the clock bit, the second comparator comparing the one bit of the clock bit with a second threshold voltage to determine whether the one bit of the clock bit is at High level or Low level;
      N flip-flops that hold the N bits of the data bit sequence in synchronization with the one bit of the clock bit; and
      a comparison circuit that receives the held N bits of the data bit sequence in parallel as the data test pattern and that compares the data test pattern with an expected value.

12. The data receiving device of claim 11,
further including:
   a selection circuit that selects, from a plural candidate values, a value of the first threshold voltage and a value of the second threshold voltage as a common value, based on a result of the comparison between the data test pattern and the expected value;
   a control circuit that controls both of the value of the first threshold voltage for the N first comparators and the value of the second threshold voltage for the second comparator to the selected common value; and
   a memory that holds the expected value corresponding to the data test pattern.

13. The data receiving device of claim 12,
further including:
   a generator that generates the common value for the first threshold voltage and the second threshold voltage to provide the N first comparators and the second comparator with the common value in parallel.

14. The data receiving device of claim 11, transmitting a test pattern request command before receipt of the test pattern.

15. The data receiving device of claim 12, wherein, when mapping information includes plural points obtained by associating the plural candidate values of the common value with plural candidate patterns of the data bit sequence and the mapping information has within the plural points a certain range of points where the data test pattern matches with the expected value corresponding to the data bit sequence, the selection circuit selects the common value corresponding to a middle point in the certain range of points.

16. The data receiving device of claim 12, storing the selected common value and using the common value stored at a time of subsequently receiving data to determine whether the data is at High level or Low level.

17. The data receiving device of claim 11, further including:
   a selection circuit that selects, from a plural candidate values, a value of the first threshold voltage and a value of the second threshold voltage as different values, based on a result of the comparison between the data test pattern and the expected value;
   a control circuit that controls the value of the first threshold voltage for the N first comparators to a first value and the value of the second threshold voltage for the second comparator to a second value different from the first value; and
   a memory that holds the expected value corresponding to the data test pattern.

18. The data receiving device of claim 11, wherein the data receiving device is a memory device.

19. The data receiving device of claim 18, wherein the data receiving device is an embedded Multi Media Card (eMMC) memory.

20. The data receiving device of claim 11, wherein the data receiving device is a memory controller that controls a NAND flash memory.

* * * * *